(12) United States Patent
Nusier et al.

(10) Patent No.: US 9,944,243 B2
(45) Date of Patent: Apr. 17, 2018

(54) PROTECTIVE GUARD FOR RESTRAINTS CONTROL MODULE

(71) Applicant: FORD GLOBAL TECHNOLOGIES, LLC, Dearborn, MI (US)

(72) Inventors: Saied Nusier, Canton, MI (US); Mohamed Ridha Baccouche, Ann Arbor, MI (US); David James Bauch, South Lyon, MI (US); Mahmoud Yousef Ghannam, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/159,276

(22) Filed: May 19, 2016

(65) Prior Publication Data

US 2017/0334382 A1 Nov. 23, 2017

(51) Int. Cl.
*B60R 21/01* (2006.01)
*B60R 21/00* (2006.01)

(52) U.S. Cl.
CPC ...... *B60R 21/01* (2013.01); *B60R 2021/0006* (2013.01); *B60R 2021/01006* (2013.01)

(58) Field of Classification Search
CPC .. B60R 2021/01006; B60R 2021/0006; B60R 21/01
See application file for complete search history.

(56) References Cited

U.S. PATENT DOCUMENTS

| 6,586,674 | B2 | 7/2003 | Krause et al. |
| 7,051,825 | B2 * | 5/2006 | Masui ...................... B60K 1/04 180/65.1 |
| 8,020,830 | B2 | 9/2011 | Oakes et al. |
| 2009/0273916 | A1 | 11/2009 | Hironaka |
| 2014/0353457 | A1 | 12/2014 | Ohmoto et al. |

* cited by examiner

*Primary Examiner* — D Glenn Dayoan
*Assistant Examiner* — Melissa A Black
(74) *Attorney, Agent, or Firm* — Jason Rogers; Brooks Kushman P.C.

(57) ABSTRACT

A guard for a restraints control module includes a corrugated base and right and left corrugated sidewalls. The sidewalls extend above the base and are spaced from a restraints control module secured to the base. The sidewalls diverge from each other in a vertical direction above the base and include alternating furrows and ridges that form the corrugations. The furrows and ridges are connected by rib walls that strengthen the guard against lateral collision forces. A method is disclosed for protecting a restraints control module in a side impact collision. According to the method, in a side impact collision, an object driven into the guard bends the sidewall towards the restraints control module to absorb the impact force applied by the object.

9 Claims, 4 Drawing Sheets

PROTECTIVE GUARD FOR RESTRAINTS CONTROL MODULE

TECHNICAL FIELD

This disclosure relates to a mounting arrangement for a vehicle restraints control module that is attached to the tunnel or floor of a vehicle between the two front seats inside the passenger compartment.

BACKGROUND

Vehicle restraint control modules are used to control deployment of air bags or other types of safety restraints during a collision. Restraint control modules must be protected to accurately and timely deploy safety restraints. Damage to the restraints control module in a severe collision can cause the module to break or be damaged. A broken restraints control module may result in an unplanned deployment or may affect deployment timing.

Vehicles are tested in a wide variety of collision tests. As shown in FIG. 1, one type of test is the 75° Oblique Left Side Test in which a vehicle 10 is driven on a movable cart into a 10 inch pole 12 at 20.7 mph. As shown in FIG. 2, less than 10 cm of spacing may be provided between the seat track 14 and the restraints control module 16. The seat tracks 14 securing the front seats of the vehicle 10 to the floor 18 may become detached and if they move more than 10 cm may cause damage to the restraints control module 16 that is attached to the floor 18, or tunnel, between the seats. As shown in FIG. 3, the restraints control module 16 may be attached to the floor 18 by a bracket 20.

The above problems and other problems are addressed by this disclosure as summarized below.

SUMMARY

According to one aspect of this disclosure, a guard for a restraints control module is provided that includes a corrugated base, right and left corrugated walls. The corrugated walls extend above the base. The right and left walls are spaced from a right side and a left side of the restraints control module that is attached to the base.

According to other aspects of this disclosure, the right and left corrugated walls may diverge from each other in a vertical direction. The right and left corrugated walls may have a plurality of furrows and ridges. The right and left corrugated walls and base walls may be formed from boron steel.

The right and left corrugated walls may have a lower end that is continuous and integral with right and left edges of the base. The corrugated walls may include a gusset formed where the lower end of the right and left corrugated walls join the right and left edges of the base, respectively.

According to another aspect of this disclosure, a restraints control module assembly is provided that includes a restraints control module that is attached to a guard. The guard includes a plurality of furrows and ridges extending in a cross-vehicle direction. The guard also includes a right sidewall, a base and a left sidewall. The sidewalls extend above the base. The furrows and ridges are provided on the right sidewall, the base and the left sidewall.

According to another aspect of this disclosure, a method is disclosed for protecting a restraints control module in a side impact collision. The method includes a first step of attaching a guard to a floor of the vehicle. The guard includes a base and right and left sidewalls that extend above the base. The right and left sidewalls include a plurality of furrows and ridges that extend in a cross-vehicle direction. A restraints control module is attached to the base of the guard between the right and left sidewalls. In a side impact collision, an object driven into one of the right and left sidewalls bends one of the sidewalls toward the restraints control module to absorb an impact force applied by the object.

According to other aspects of the method, the ridges and furrows include a ridge portion on the base that contacts the restraints control module and a furrow portion on the base that contacts the floor of the vehicle. Rib walls extend between the ridge portion and the furrow portion. The rib walls on the sidewalls extend laterally and an impact force applied to either of the right or left sidewalls deforms the rib walls in a lateral direction.

According to other aspects of the method, the right and left sidewalls each have an upper edge and a lower end. The upper edge is spaced from the restraints control module to a greater extent than the lower edge of the sidewalls is spaced from the restraints control module. The impact force applied to the sidewalls moves the upper edge toward the restraints control module and bends the sidewalls at the base.

The impact force applied by the object is initially absorbed by the sidewalls and transferred through the sidewalls to the base before the sidewalls are driven into contact with the restraints control module.

The above aspects of this disclosure and other aspects are described below with reference to the attached drawings.

DETAILED DESCRIPTION

The illustrated embodiments are disclosed with reference to the drawings. However, it is to be understood that the disclosed embodiments are intended to be merely examples that may be embodied in various and alternative forms. The figures are not necessarily to scale and some features may be exaggerated or minimized to show details of particular components. The specific structural and functional details disclosed are not to be interpreted as limiting, but as a representative basis for teaching one skilled in the art how to practice the disclosed concepts.

Figure 1:
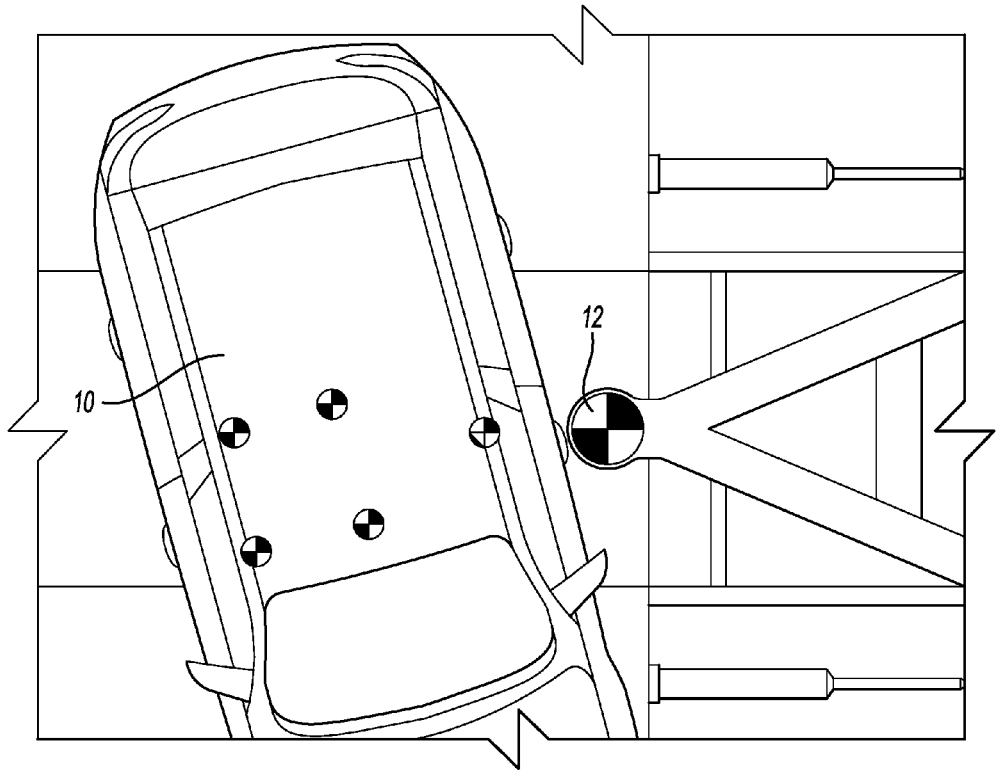
FIG. 1 is a fragmentary diagrammatic view of a 75° Oblique Left Side Test showing a vehicle being driven on a movable cart into a 10 inch pole.
Figure 2:
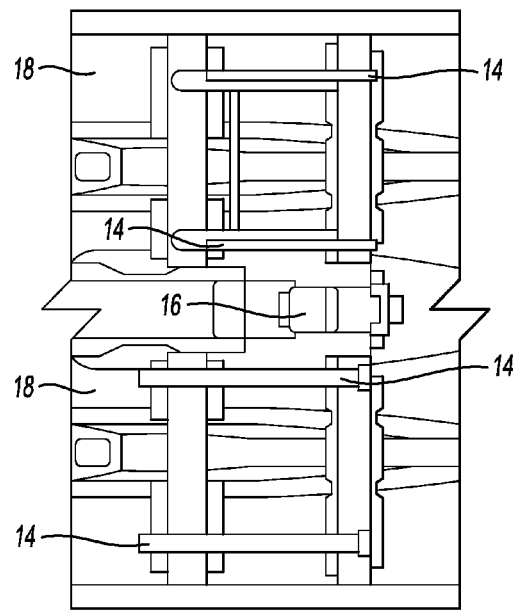
FIG. 2 is a fragmentary diagrammatic view of the front seat tracks and a restraints control module attached to the floor of a passenger compartment between the two front seats of a vehicle.
Figure 3:
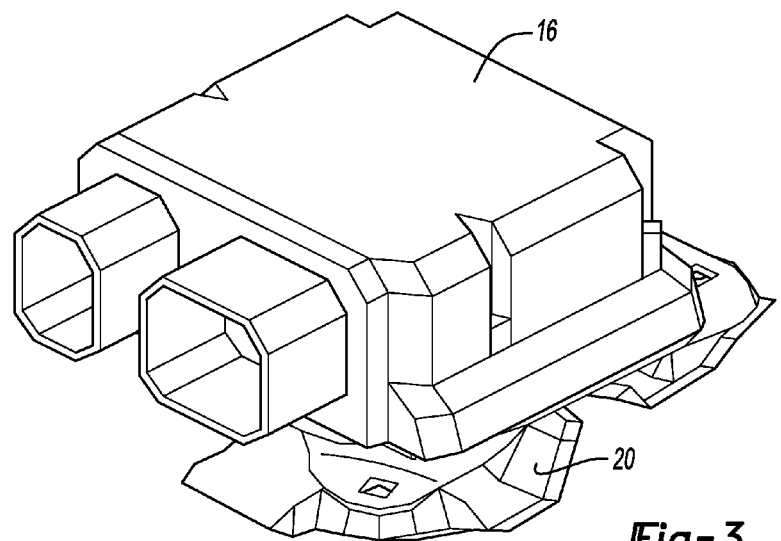
FIG. 3 is a perspective view of a prior art restraints control module and bracket.

FIGS. 1-3 of the drawings are addressed above in the Background section of this application.

Referring to FIGS. 4-7, a guard 22 for a restraints control module (RCM) 24 is illustrated. The guard 22 is secured to the floor 26 of a vehicle 10.

The guard 22 includes a base 28 that is secured to the floor 26. A right sidewall 30 and left sidewall 32 extend upwardly from the base 28. The right and left sidewalls 30, 32 diverge as they extend to a greater extent in the vertical direction "V" away from the base 28. The base 28 includes a right edge 36 connected to the right sidewall 30 and a left edge 38 connected to the left sidewall 32. A lower end 40 of the right and left sidewalls 30, 32 is integrally and continuously formed in one piece from the base 28. An upper edge 42 of the right and left sidewalls 30, 32 form a distal end of the right and left sidewalls 30, 32. The upper edges 42 are spaced apart to a greater extent than the lower edge 40 thereby providing sidewalls 30, 32 that diverge from the right and left edges 36, 38 of the base 28.

Figure 5:
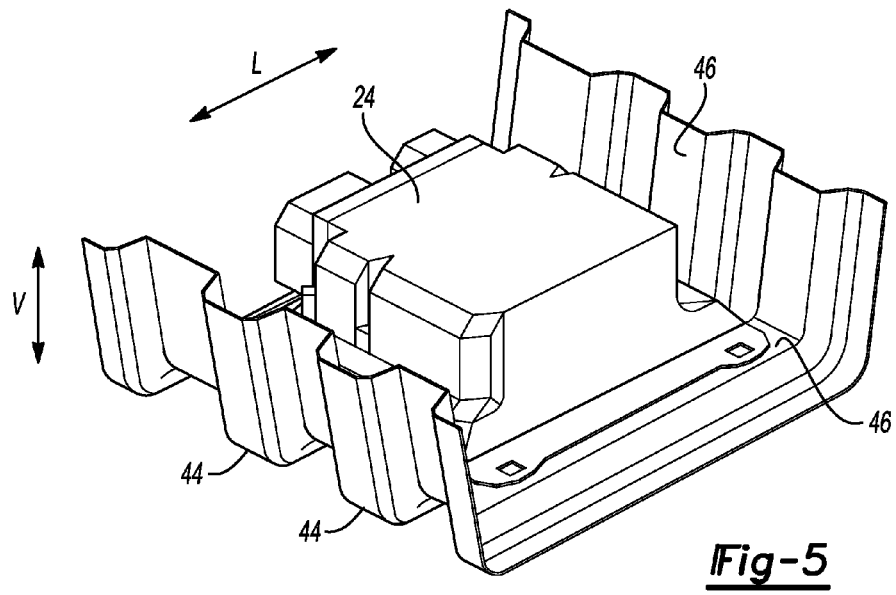
FIG. 5 is a left/rear perspective view of the guard and restraints control module of FIG. 4.
Figure 6:
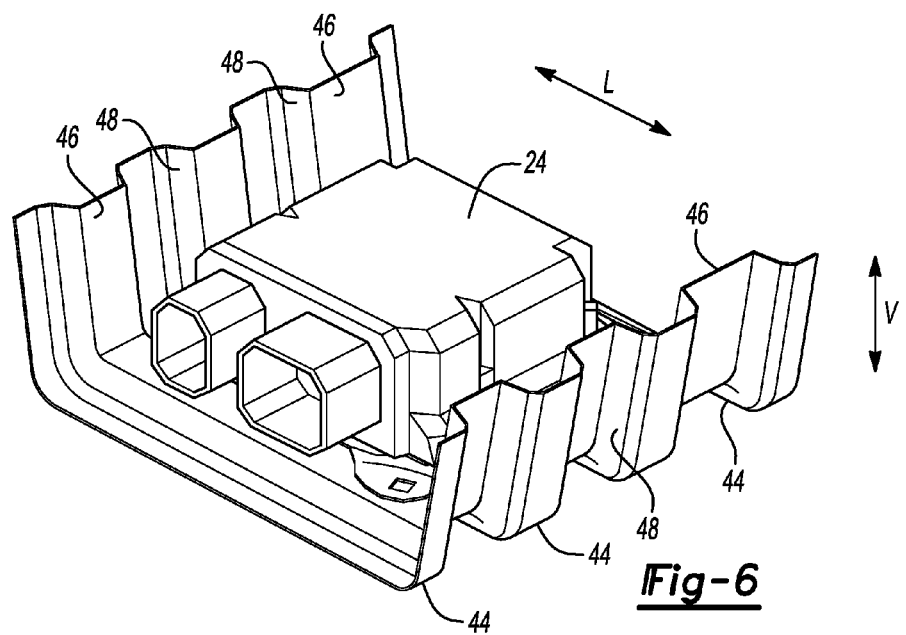
FIG. 6 is a left/front perspective view of the guard and restraints control module of FIG. 4.
Figure 7:
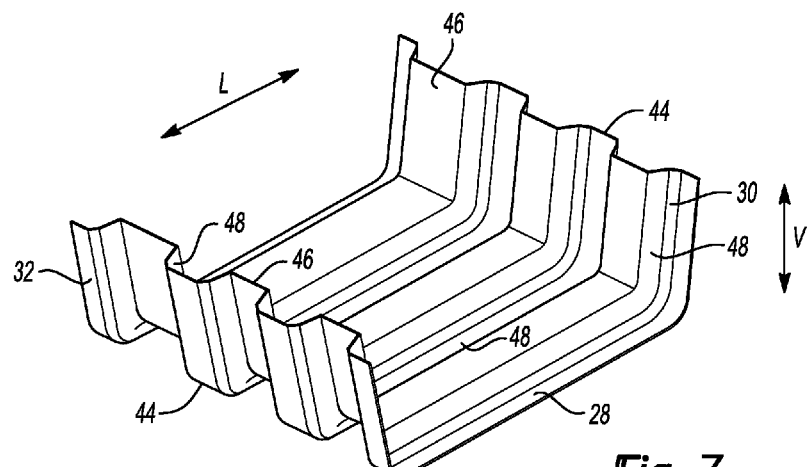
FIG. 7 is a perspective view of the guard of FIG. 4.

Referring to FIGS. 5-7, the right and left sidewalls 30, 32 are corrugated sidewalls. The left and right sidewalls 30, 32 include furrows 44 and ridges 46 in an alternating arrangement. A rib wall 48 extends between the furrows 44 and ridges 46. The rib wall 48 extends substantially in a lateral direction indicated by the letter "L" in the figures. The rib wall 48 strengthens the sidewalls 30, 32 against lateral impacts. When the sidewalls are contacted by an object in a lateral direction, the rib wall 48 is oriented to resist deformation of the sidewalls 30, 32 toward the RCM 24.

Figure 4:
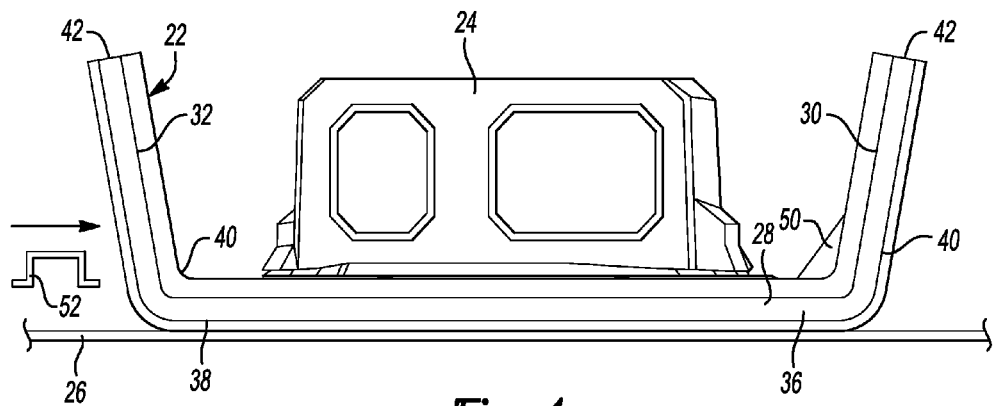
FIG. 4 is a front elevation view of a guard for a restraints control module made according to one aspect of this disclosure.

As shown in FIG. 4, one or more gussets 50 may be provided at the junction of the lower ends 40 of the sidewalls 30, 32 with the right edge 36 and left edge 38 of the base 28. The gusset 50 may be included to increase the bending resistance of the right and left sidewalls 30, 32.

An object 52 is shown moving in the lateral "L" direction, or cross-vehicle direction, towards the left sidewall 32. Driving the object 52 into the left sidewall 32 causes the left sidewall 32 to bend at the lower edge 40 with the upper edge 42 moving towards the restraints control module 24. As the sidewall 32 is bent inwardly, the furrows 44, ridges 46 and rib wall 48 are deformed laterally.

Figure 8:
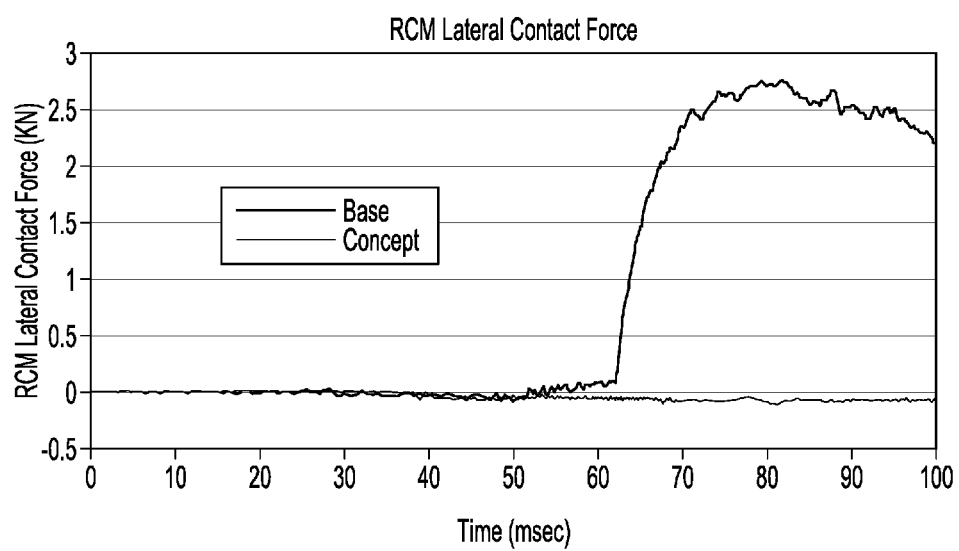
FIG. 8 is a chart of the lateral contact force applied to a restraints control module in a 75° Oblique Left Side Test side impact collision over time.

Referring to FIG. 8, a chart of the lateral contact force applied to the RCM 24 is provided. The lateral contact force is measured in Kilonewtons (KN). In the base design represented by FIG. 3, the lateral contact force begins rapidly increasing at 60 msec until reaching approximately 2.5 KN. With the design of FIGS. 4-7 in 1.3 mm boron steel, the lateral contact force indicates that no significant force is applied to the RCM 24 within the time period of 100 msec.

The embodiments described above are specific examples that do not describe all possible forms of the disclosure. The features of the illustrated embodiments may be combined to form further embodiments of the disclosed concepts. The words used in the specification are words of description rather than limitation. The scope of the following claims is broader than the specifically disclosed embodiments and also includes modifications of the illustrated embodiments.

What is claimed is:

1. A guard comprising:
    a corrugated base;
    right and left corrugated walls extending above the base and having a lower end continuous and integral with right and left edges of the base, wherein the right and left corrugated walls are spaced from a restraints control module attached to the base; and
    a gusset formed where the lower end of the right and left corrugated walls are joined to the right and left edges of the base.

2. The guard for a restraints control module of claim 1 wherein the right and left corrugated walls diverge from each other in a vertical direction.

3. The guard for a restraints control module of claim 1 wherein the right and left corrugated walls have a lower end that is continuous and integral with right and left edges of the base.

4. The guard for a restraints control module of claim 1 wherein the right and left corrugated walls have a plurality of furrows and ridges.

5. The guard for a restraints control module of claim 1 wherein the right and left corrugated walls are boron steel.

6. A method of protecting a restraints control module for a vehicle in a side impact collision, the method comprising:
    attaching a guard to a floor of the vehicle, wherein the guard includes a base and right and left sidewalls that extend above the base, the right and left sidewalls including a plurality of furrows and ridges extending in a cross-vehicle direction, wherein the ridges and furrows include a ridge portion on the base that contacts the restraints control module and a furrow portion on the base that contacts the floor of the vehicle, and rib walls extending between the ridge portions and the furrow portions; and
    attaching the restraints control module to the base of the guard between the right and left sidewalls, wherein in the side impact collision an object driven into one of the right and left sidewalls bends the one sidewall toward the restraints control module to absorb an impact force applied by the object.

7. The method of claim 6 wherein the rib walls on the sidewalls extend laterally, and wherein the impact force applied to the right and left sidewalls deforms the rib walls in a lateral direction.

8. A method of protecting a restraints control module for a vehicle in a side impact collision, the method comprising:
    attaching a guard to a floor of the vehicle, wherein the guard includes a base and right and left sidewalls that extend above the base, the right and left sidewalls including a plurality of furrows and ridges extending in a cross-vehicle direction, wherein the right and left sidewalls each have an upper edge and a lower end; and
    attaching the restraints control module to the base of the guard between the right and left sidewalls, wherein in the side impact collision an object driven into one of the right and left sidewalls bends the one sidewall toward the restraints control module to absorb an impact force applied by the object wherein the upper edge is spaced from the restraints control module to a greater extent than the lower edge of the sidewalls is spaced from the restraints control module, wherein the impact force applied to the sidewalls moves the upper edge toward the restraints control module and bends the sidewalls where the sidewalls extend from the base.

9. The method of claim 8 wherein the impact force applied by the object is initially absorbed by the sidewalls and transferred through the sidewalls to the base before the sidewalls are driven into contact with the restraints control module.

* * * * *